United States Patent
Koyama

(10) Patent No.: US 8,427,417 B2
(45) Date of Patent: Apr. 23, 2013

(54) DRIVER CIRCUIT, DISPLAY DEVICE INCLUDING THE DRIVER CIRCUIT, AND ELECTRONIC DEVICE INCLUDING THE DISPLAY DEVICE

(75) Inventor: Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 437 days.

(21) Appl. No.: 12/877,705

(22) Filed: Sep. 8, 2010

(65) Prior Publication Data

US 2011/0064186 A1    Mar. 17, 2011

(30) Foreign Application Priority Data

Sep. 16, 2009   (JP) .................................. 2009-214297

(51) Int. Cl.
  *G09G 3/36*   (2006.01)
(52) U.S. Cl.
  USPC ......................................... 345/100; 257/215
(58) Field of Classification Search .......... 345/204–215, 345/690–699, 98–100; 257/314, 326, 327, 257/348, 359, 215
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,202,863 B2 | 4/2007 | Kimura et al. |
| 7,205,610 B2 | 4/2007 | Koyama |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Kent Chang
*Assistant Examiner* — William Lu
(74) *Attorney, Agent, or Firm* — Fish & Richardson P.C.

(57) ABSTRACT

A driver circuit where malfunctions in the circuit can be suppressed even when a thin film transistor is changed into an enhancement transistor or a depletion transistor is provided. In a pulse output circuit, a circuit for raising potentials of source terminals of first and second transistors from low power supply potentials is provided between the source terminals of the first and second transistors and a wiring for supplying a low power supply potential. Further, a switch for setting the potentials of the source terminals of the first and second transistors to low power supply potentials is provided. The switch is controlled by a judgment circuit for judging whether the first and second transistors are enhancement transistors or depletion transistors.

8 Claims, 11 Drawing Sheets

U.S. PATENT DOCUMENTS

| | | |
|---|---|---|
| 7,211,825 B2 | 5/2007 | Shih et al. |
| 7,218,349 B2 | 5/2007 | Kimura |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,633,471 B2 * | 12/2009 | Yamazaki et al. ............. 345/83 |
| 7,674,650 B2 | 3/2010 | Akimoto et al. |
| 7,687,808 B2 * | 3/2010 | Umezaki ........................ 257/72 |
| 7,732,819 B2 | 6/2010 | Akimoto et al. |
| 8,319,561 B2 * | 11/2012 | Venugopal et al. ........... 330/307 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0220587 A1 | 10/2006 | Tobita et al. |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0086558 A1 | 4/2007 | Wei et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0002805 A1 | 1/2008 | Tobita et al. |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0079001 A1 | 4/2008 | Umezaki et al. |
| 2008/0079685 A1 * | 4/2008 | Umezaki et al. .............. 345/100 |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 * | 3/2009 | Kuwabara et al. ............ 348/790 |
| 2009/0114910 A1 | 5/2009 | Chang |
| 2009/0115709 A1 * | 5/2009 | Yamashita et al. .............. 345/76 |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0310734 A1 | 12/2009 | Umezaki |
| 2010/0026619 A1 | 2/2010 | Umezaki |
| 2010/0134396 A1 | 6/2010 | Umezaki |
| 2011/0102409 A1 | 5/2011 | Hayakawa |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 01-233914 A | 9/1989 |
| JP | 05-251705 A | 9/1993 |
| JP | 08-006653 A | 1/1996 |
| JP | 08-264794 A | 10/1996 |
| JP | 09-116408 A | 5/1997 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-251348 A | 9/2005 |
| JP | 2011-120221 A | 6/2011 |
| WO | 2004/114391 A1 | 12/2001 |
| WO | 2011/052368 A1 | 5/2011 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al.. "First Principles Methods Using CASTEP," Zeitschrift fur Kristallographie, 2005, vol. 220. pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett.

(Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT, " AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZNO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H et al., "68.3: Invited Paper:Transparent Amorphous Oxide Semiconductors for High Perforance TFT," SID Digest '07: SID International Symposium Digest of Technical Papers, 2007, vol. 38, pp. 1830-1833.

Hsieh, H et al., "P-29: Modeling of Amorphous Oxide Semiconductor Thin Film Transistor and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, pp. 165202-1-165202-22.

Janotti, A et al., "Oxygen Vacancies in ZnO," Appl. Phys. Lett. (Applied Physics Letters) , 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures Over 1000° C," Journal of Solid State Chemistry, 1985 vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn, J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In-Ga-Zn-Oxide TFTS With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci, Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park; et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park. J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al.. "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0—In. AMOLED Display With Driver Circuit Using Amorphous In-Ga-Zn-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide, " Phys. Rev. Lett. (Physical Review Letters), Jul. 31, 2000, vol. 85, No. 5, pp. 1012-1015.

International Search Report, PCT Application No. PCT/JP2010/064320, dated Dec. 7, 2010, 2 pages.

Written Opinion, PCT Application No. PCT/JP2010/064320, dated Dec. 7, 2010, 4 pages.

* cited by examiner

DRIVER CIRCUIT, DISPLAY DEVICE INCLUDING THE DRIVER CIRCUIT, AND ELECTRONIC DEVICE INCLUDING THE DISPLAY DEVICE

TECHNICAL FIELD

The present invention relates to a driver circuit (also referred to as a shift register circuit). The present invention also relates to a display device including a driver circuit formed over the same substrate as a pixel portion, and an electronic device including the display device.

BACKGROUND ART

With the spread of large display devices such as liquid crystal televisions, display devices have needed higher added value and developed. In particular, a technique for forming a driver circuit such as a scan line driver circuit over the same substrate as a pixel portion with the use of a thin film transistor (TFT) whose channel region is formed using an amorphous semiconductor (especially, an oxide semiconductor) has actively developed.

A thin film transistor whose channel region is formed using an amorphous semiconductor is often used for a driver circuit formed using only n-channel transistors or p-channel transistors. For example, a structure disclosed in Reference 1 can be given.

REFERENCE

[Reference 1] Japanese Published Patent Application No. 2005-251348

DISCLOSURE OF INVENTION

When a thin film transistor whose channel region is formed using an amorphous semiconductor is used for a driver circuit formed using only n-channel transistors or p-channel transistors, malfunctions might occur due to variation in the threshold voltage or the like. Specific problems caused by variation in the threshold voltage are described in detail with reference to FIGS. 11A and 11B.

A circuit which is formed using only n-channel transistors or p-channel transistors and is illustrated in FIG. 11A is a first stage of a pulse output circuit included in a shift register disclosed in FIG. 1 in Reference 1 as an example. The circuit illustrated in FIG. 11A includes a transistor Tr11, a transistor Tr12, a transistor Tr13, a transistor Tr14, a transistor Tr15, a transistor Tr16, and a capacitor CA. In FIG. 11A, a node of a gate terminal of the transistor Tr12 is denoted by NA; a node of a gate terminal of the transistor Tr13 is denoted by NB; and a node of an output terminal is denoted by NC. In addition, in FIG. 11A, a first clock signal CK1 is input to the transistor Tr12; a second clock signal CK2 is input to the transistor Tr14; a start pulse $V_{st}$ is input to the transistor Tr11 and the transistor Tr15; and a low power supply potential ($V_{ss}$) is supplied to the transistor Tr13, the transistor Tr15, and the transistor Tr16. Further, in FIG. 11A, a signal GS_(1) is a signal of the first stage of the pulse output circuit. A timing chart illustrated in FIG. 11B is a timing chart of the circuit illustrated in FIG. 11A, which corresponds to a timing chart disclosed in FIG. 2 in Reference 1. Elements in FIG. 11A operate in accordance with signals in FIG. 11B.

In order that an output signal be a signal having a high power supply potential (also referred to as an H-level signal), the node NA in FIG. 11A is periodically in an electrically floating state and is supplied with a predetermined potential. In FIG. 11B, dotted lines of NA indicate periods during which the node NA is in a floating state, and solid lines of NA indicate periods during which the node NA is supplied with a predetermined potential. Similarly, in order that an output signal be kept as a signal having a low power supply potential (also referred to as an L-level signal), the node NB in FIG. 11A is periodically in an electrically floating state and is supplied with a predetermined potential. In FIG. 11B, dotted lines of NB indicate periods during which the node NB is in a floating state, and solid lines of NB indicate periods during which the node NB is supplied with a predetermined potential.

As described above, when a thin film transistor whose channel region is formed using an amorphous semiconductor is used for a driver circuit formed using only n-channel transistors or p-channel transistors, the transistor might be an enhancement (also referred to as normally-off) transistor or a depletion (also referred to as normally-on) transistor due to variation in the threshold voltage. The normally-on transistor has a problem in that an output signal cannot be kept as an H-level signal because a potential of the node NA is lowered due to leakage current from the transistor Tr16 especially in a period A in FIG. 11B. Similarly, the normally-on transistor has a problem in that an output signal cannot be kept as an L-level signal even when a gate potential is at an L level because a potential of the node NB is lowered due to leakage current from the transistor Tr15 especially in a period B in FIG. 11B. Further, when a potential supplied to each terminal is adjusted in order to prevent the transistor from being normally on, there is a problem in that desired operation cannot be performed when the transistor is normally off.

Note that in the case of a driver circuit which sequentially outputs pulses by dynamic driving, without limitation to the example illustrated in FIGS. 11A and 11B, the increase of leakage current causes malfunctions. In addition, in the case where driver circuits including pulse output circuits are manufactured, whether transistors are enhancement transistors or depletion transistors vary among substrates in some cases. In such a case, in circuit design where countermeasures when the transistors are enhancement transistors or depletion transistors are taken in advance, there might be a problem in that countermeasures against the other transistors cannot easily be performed. Therefore, it is necessary to employ circuit design where a driver circuit does not malfunction regardless of whether transistors are enhancement transistors or depletion transistors.

In view of the foregoing problems, it is an object of one embodiment of the present invention to provide a driver circuit formed using only n-channel transistors or p-channel transistors where malfunctions in the circuit can be suppressed even when a thin film transistor whose channel is formed using an amorphous semiconductor is used and the transistor is changed into an enhancement transistor or a depletion transistor due to variation in the threshold voltage that is caused by a manufacturing condition or the like of the thin film transistor.

One embodiment of the present invention is a driver circuit including plural stages of pulse output circuits. Each of the pulse output circuits includes a first circuit for outputting an output signal in accordance with a potential of a first node and a potential of a second node; a second circuit for supplying a signal corresponding to an output signal from a pulse output circuit in a preceding stage to the first node; a third circuit for intermittently supplying a signal having a high power supply potential to the second node; a first transistor for controlling the potential of the first node in accordance with the potential of the second node; and a second transistor for controlling the potential of the second node. The second node is electrically connected to a gate of the first transistor. The signal corresponding to the output signal from the pulse output circuit in the preceding stage is supplied to a gate of the second transistor. A fourth circuit for raising potentials of source terminals of the first and second transistors from low power supply potentials is provided between the source terminals of the first and second transistors and a wiring for supplying a low power supply potential. A switch for setting the potentials of the source terminals of the first and second transistors to low power supply potentials is provided. The switch is controlled by a judgment circuit for judging whether the first and second transistors are enhancement transistors or depletion transistors.

In one embodiment of the present invention, the fourth circuit may include a transistor. A gate and a drain terminal of the transistor are electrically connected to each other, and a source terminal of the transistor is electrically connected to a wiring to which a low power supply potential is supplied.

In one embodiment of the present invention, L/W of the transistor included in the fourth circuit may be higher than L/W of each of the first transistor and the second transistor.

In one embodiment of the present invention, the judgment circuit may include a constant current source, a transistor, a comparator, and a buffer circuit.

In one embodiment of the present invention, the switch may be a transistor.

In one embodiment of the present invention, the transistor included in the driver circuit may have a semiconductor layer formed using an oxide semiconductor layer.

According to one embodiment of the present invention, it is possible to provide a driver circuit formed using only n-channel transistors or p-channel transistors where malfunctions in the circuit can be suppressed even when a thin film transistor whose channel is formed using an amorphous semiconductor is used and the transistor is changed into an enhancement transistor or a depletion transistor due to variation in the threshold voltage that is caused by a manufacturing condition or the like of the thin film transistor.

BEST MODE FOR CARRYING OUT THE INVENTION

Figure 1:
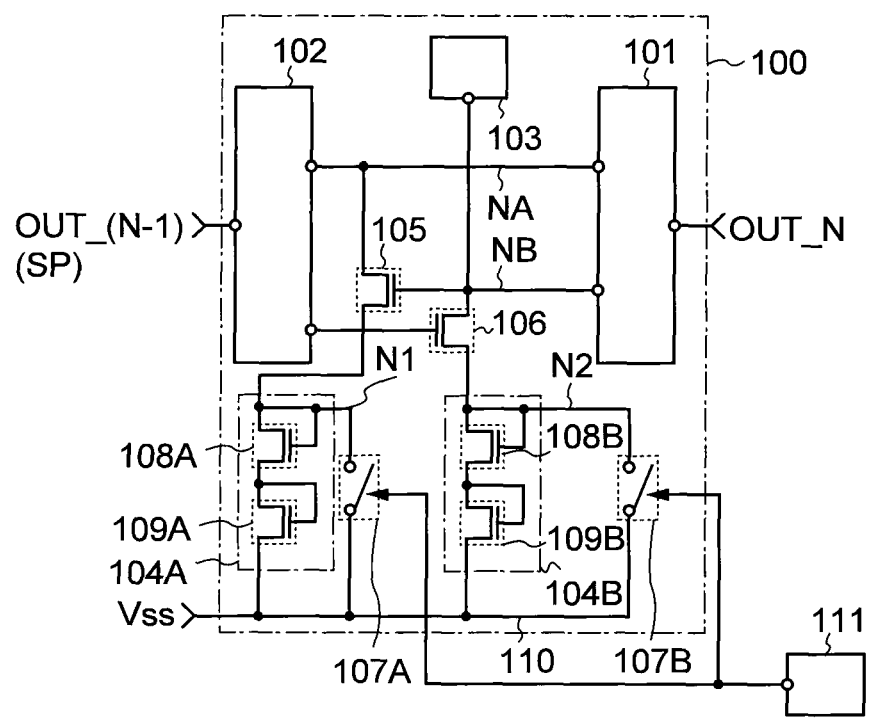
FIG. 1 illustrates an example of a pulse output circuit.

Hereinafter, embodiments of the present invention will be described with reference to the drawings. Note that the present invention can be implemented in various different ways and it will be readily appreciated by those skilled in the art that modes and details of the present invention can be changed in various ways without departing from the spirit and scope of the present invention. Therefore, the present invention should not be construed as being limited to the following description of the embodiments. Note that in structures of the present invention described below, reference numerals denoting the same portions are used in common in different drawings.

Note that the size, the thickness of a layer, or a region in each structure illustrated in drawings and the like in embodiments is exaggerated for simplicity in some cases. Therefore, embodiments of the present invention are not limited to such scales.

Note that in this specification, terms such as "first", "second", "third", and "N-th" (N is a natural number) are used in order to avoid confusion among components and do not limit the number.

Embodiment 1

In this embodiment, first, the structure of one stage of a pulse output circuit in a driver circuit including plural stages of pulse output circuits is described with reference to drawings.

A pulse output circuit 100 illustrated in this embodiment includes a first circuit 101, a second circuit 102, a third circuit 103, fourth circuits 104A and 104B, a first transistor 105, a second transistor 106, and switches 107A and 107B. Note that each transistor included in the pulse output circuit 100 is an n-channel thin film transistor.

Note that an oxide semiconductor may be used for a semiconductor layer of each transistor included in the pulse output circuit 100. A transistor formed using an oxide semiconductor has higher field-effect mobility than a transistor formed using a silicon-based semiconductor material such as amorphous silicon. Note that zinc oxide (ZnO), tin oxide ($SnO_2$), or the like can be used as the oxide semiconductor. In addition, In, Ga, or the like can be added to ZnO.

As the oxide semiconductor, a thin film represented by $InMO_3 (ZnO)_x$ (x>0) can be used. Note that M denotes one or more metal elements selected from gallium (Ga), iron (Fe), nickel (Ni), manganese (Mn), or cobalt (Co). As an example, M might be Ga or might include the above metal element in addition to Ga, for example, M might be Ga and Ni or Ga and Fe. Further, in the oxide semiconductor, in some cases, a transitional metal element such as Fe or Ni or an oxide of the transitional metal is contained as an impurity element in addition to the metal element contained as M. For example, an In—Ga—Zn—O-based film can be used for an oxide semiconductor layer.

As the oxide semiconductor film ($InMO_3 (ZnO)_x$ (x>0) film), an $InMO_3(ZnO)_x$ (x>0) film in which M is a different metal element may be used instead of the In—Ga—Zn—O-based film. As the oxide semiconductor, any of the following oxide semiconductors can be used in addition to the above: an In—Sn—Zn—O-based oxide semiconductor; an In—Al—Zn—O-based oxide semiconductor; a Sn—Ga—Zn—O-based oxide semiconductor; an Al—Ga—Zn—O-based oxide semiconductor; a Sn—Al—Zn—O-based oxide semiconductor; an In—Zn—O-based oxide semiconductor; a Sn—Zn—O-based oxide semiconductor; an Al—Zn—O-based oxide semiconductor; an In—O-based oxide semiconductor; a Sn—O-based oxide semiconductor; and a Zn—O-based oxide semiconductor.

Note that the first circuit 101 is a circuit for outputting a signal having a high power supply potential or a signal having a low power supply potential as an output signal in accordance with potentials of a first node NA and a second node NB and for making the output signal be an output signal OUT_(N) in the stage (an N-th stage in FIG. 1) in accordance with the potentials of the first node NA and the second node NB.

Note that a high power supply potential refers to a potential which is higher than a reference potential, and a low power supply potential refers to a potential which is lower than or equal to the reference potential. Note that the high power supply potential and the low power supply potential are preferably potentials such that a transistor can operate, i.e., potentials such that an ideal transistor (whose threshold voltage is 0 V) is turned on when a high power supply potential is applied to a gate and the ideal transistor is turned off when a low power supply potential is applied.

Note that voltage refers to a potential difference between a given potential and a reference potential (e.g., a ground potential) in many cases. Accordingly, voltage, a potential, and a potential difference can be referred to as a potential, voltage, and a voltage difference, respectively.

Note that the structure of a thin film transistor can be a variety of structures without being limited to a certain structure. For example, a multi-gate structure having two or more gate electrodes can be used.

Further, a structure where gate electrodes are formed above and below a channel region can be used. Note that when the gate electrodes are formed above and below the channel region, a structure where a plurality of transistors are connected in parallel can be used.

Note that when it is explicitly described that "A and B are connected", the case where A and B are electrically connected, the case where A and B are functionally connected, and the case where A and B are directly connected are included therein. Here, each of A and B is an object (e.g., a device, an element, a circuit, a wiring, an electrode, a terminal, a conductive film, or a layer). Accordingly, another element may be interposed between elements having a connection relation illustrated in drawings and texts, without limitation to a predetermined connection relation, for example, the connection relation illustrated in the drawings and the texts.

Note that the first node NA is a node which is connected to the first circuit 101, the second circuit 102, and the first transistor 105, and the second node NB is a node which is connected to the first circuit 101, the third circuit 103, the first transistor 105, and the second transistor 106.

The second circuit 102 is a circuit for supplying a signal corresponding to an output signal OUT_(N−1) in a preceding stage of a pulse output circuit (a start pulse SP in a first stage) to the first node NA. Further, the second circuit 102 is a circuit for outputting the output signal OUT_(N−1) in the preceding stage of the pulse output circuit to a gate of the second transistor 106.

The third circuit 103 is a circuit for intermittently supplying signals having high power supply potentials to the second node NB in response to predetermined timing obtained by input of clock signals or the like.

The second node NB is connected to a gate of the first transistor 105. A drain terminal of the first transistor 105 is connected to the first node NA. The first transistor 105 is a transistor for controlling a potential of the first node NA in accordance with a potential of the second node NB.

A signal corresponding to the output signal OUT_(N−1) in the preceding stage of the pulse output circuit is supplied to a gate of the second transistor 106. A drain terminal of the second transistor 106 is connected to the second node NB. The second transistor 106 is a transistor for controlling the potential of the second node NB.

Note that a thin film transistor is an element having at least three terminals: a gate terminal, a drain terminal, and a source terminal. The thin film transistor has a channel region between a drain region and a source region, and current can flow through the drain region, the channel region, and the source region. In this specification, a terminal which is connected to a wiring side for supplying a high power supply potential is referred to as a drain terminal, and a terminal which is connected to a wiring side to which a low power supply potential is supplied is referred to as a source terminal. Note that the source terminal and the drain terminal are referred to as a first terminal and a second terminal in some cases.

The fourth circuit 104A is provided between a source terminal of the first transistor 105 and a wiring 110 for supplying a low power supply potential. The fourth circuit 104A makes a potential of the source terminal of the first transistor 105 higher than a potential of the wiring 110. Further, the fourth circuit 104B is provided between a source terminal of the second transistor 106 and the wiring 110 for supplying a low power supply potential, like the fourth circuit 104A. The fourth circuit 104B makes a potential of the source terminal of the second transistor 106 higher than the potential of the wiring 110.

Note that in the structure illustrated in this embodiment, a third transistor 108A and a fourth transistor 109A are provided as the fourth circuit 104A, and a gate and a drain terminal of each transistor are connected to each other so as to be short-circuited. Accordingly, the potential of the source terminal of the first transistor 105, i.e., a potential of a third node N1 can be made higher than the potential of the wiring 110 by the sum of the threshold voltage of the third transistor 108A and the threshold voltage of the fourth transistor 109A. Similarly, a third transistor 108B and a fourth transistor 109B are provided as the fourth circuit 104B, and a gate and a drain terminal of each transistor are connected to each other so as to be short-circuited. Accordingly, the potential of the source terminal of the second transistor 106, i.e., a potential of a third node N2 can be made higher than the potential of the wiring 110 by the sum of the threshold voltage of the third transistor 108B and the threshold voltage of the fourth transistor 109B. Note that one of the fourth circuit 104A and the fourth circuit 104B may be eliminated, or the fourth circuit 104A and the fourth circuit 104B may be duplicated with a plurality of transistors.

Note that the fourth circuit 104A and the first transistor 105, and the fourth circuit 104B and the second transistor 106 are provided depending on the number of nodes which are made to be in a floating state in order to control the first circuit 101. The first node NA and the second node NB are illustrated in this embodiment, for example. Further, although the third transistor 108A and the fourth transistor 109A are provided as the fourth circuit 104A and the third transistor 108B and the fourth transistor 109B are provided as the fourth circuit 104B in this embodiment, the potentials of the third nodes N1 and N2 may be raised by the increase in the number of transistors. Furthermore, in order to further reduce the amount of off-state current, the resistance values of the third transistor 108A, the fourth transistor 109A, the third transistor 108B, and the fourth transistor 109B which are included in the fourth circuits 104A and 104B are preferably higher than those of the first transistor 105 and the second transistor 106 in advance.

In other words, L/W of the third transistor 108A, the fourth transistor 109A, the third transistor 108B, and the fourth transistor 109B which are included in the fourth circuits is preferably higher than L/W of the first transistor 105 and the second transistor 106. Further, the thickness of each of semiconductor layers of the third transistor 108A, the fourth transistor 109A, the third transistor 108B, and the fourth transistor 109B which are included in the fourth circuits is preferably smaller than that of the first transistor 105 and the second transistor 106. Note that the gate length L corresponds to length between a source and a drain in a region where a gate and a semiconductor layer of a transistor overlap with each other, and the gate width W corresponds to width between the source and the drain in the region where the gate and the semiconductor layer of the transistor overlap with each other. Therefore, L/W of the transistor corresponds to a ratio of the gate length to the gate width.

The switch 107A is a circuit for short-circuiting the source terminal of the first transistor 105, i.e., the third node N1 and the wiring 110 to which a low power supply potential is supplied. The switch 107B is a circuit for short-circuiting the source terminals of the first and second transistors 105 and 106, i.e., the third node N2 and the wiring 110 to which a low power supply potential is supplied. Note that the switches 107A and 107B may be formed using transistors manufactured in a manner similar to those of the first to fourth transistors. On/off of the switches 107A and 107B is controlled with a judgment signal supplied from a judgment circuit 111 which is provided outside. Note that when the switches 107A and 107B are formed using transistors, a signal from the judgment circuit 111 is preferably a signal having a potential for turning on or off the transistors surely. A plurality of switches having functions which are similar to those of the switches 107A and 107B may be provided.

In other words, in the case where the first transistor 105 and the second transistor 106 are normally on, the potentials of the third nodes N1 and N2 are made higher than the low power supply potential $V_{ss}$ with the fourth circuits 104A and 104B so that current does not easily flow between the first transistor 105 and the second transistor 106; or in the case where the first transistor 105 and the second transistor 106 are normally off, the potentials of the third nodes N1 and N2 are lowered to the low power supply potential with the switches 107A and 107B short-circuited so that current easily flows between the first transistor 105 and the second transistor 106. Therefore, the first transistor 105 and the second transistor 106 can operate without problems. Note that in the case where the switches 107A and 107B are formed using transistors, a structure is preferably used in which a signal having an adequate voltage level is applied to gates of the transistors which serve as the switches 107A and 107B from the judgment circuit 111 provided outside because the operation becomes unstable when the transistors are normally on.

Next, a structure example of the judgment circuit 111 is described with reference to FIG. 2.

The judgment circuit 111 includes a constant current source 201, a transistor 202, a comparator 203 (also referred to as a comparison circuit), and a buffer circuit 204. Note that for illustrative purposes, a node where the constant current source 201, the transistor 202, and the comparator 203 are connected to each other is referred to as a node NE.

Figure 2:
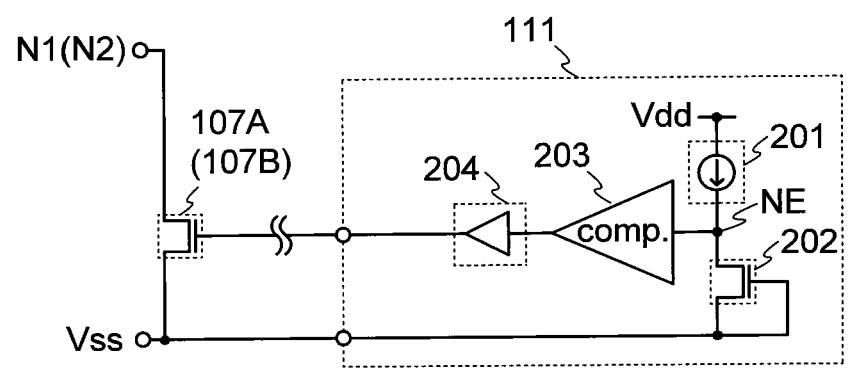
FIG. 2 illustrates an example of a judgment circuit.

In FIG. 2, one terminal of the constant current source 201 is connected to a wiring for supplying a high power supply potential $V_{dd}$, and the other terminal of the constant current source 201 is connected to the node NE. A drain terminal of the transistor 202 is connected to the node NE, and a gate and a source terminal of the transistor 202 are connected to a wiring for supplying the low power supply potential $V_{ss}$. An input terminal of the comparator 203 is connected to the node NE, and an output terminal of the comparator 203 is connected to an input terminal of the buffer circuit 204. An output terminal of the buffer circuit 204 is connected to the gates of the transistors which serve as the switches 107A and 107B.

Note that the buffer circuit 204 is provided in order to improve the electric charge supply capability of a signal which is to be input to a pulse output circuit in each stage is improved when the judgment circuit 111 is apart from the switches 107A and 107B formed using transistors. The buffer circuit 204 may be eliminated.

In the judgment circuit 111, the transistor 202 is a transistor for judging whether the transistor included in the driver circuit is normally on or off, is formed over the same substrate and in the same condition as the transistor, and has the same transistor characteristics as the transistor. When current flowing from the constant current source 201 flows through the transistor 202, the judgment circuit 111 judges the level of a potential of the node NE depending on whether the transistor 202 is normally on or off so that on/off of the switches 107A and 107B is controlled. Note that when the transistor 202 is normally on, the potential of the node NE is lowered as compared to the case where the transistor 202 is normally off. Note that the comparator 203 compares a predetermined reference potential (e.g., an intermediate potential between the high power supply potential $V_{dd}$ and the low power supply potential $V_{ss}$) with the potential of the node NE. When the transistor 202 is normally off, the comparator 203 outputs a signal having a high power supply potential. When the transistor 202 is normally on, the comparator 203 outputs a signal having a low power supply potential. Then, the signal is changed into a voltage signal (a judgment signal) for adequately controlling on/off of the switches 107A and 107B formed using transistors in the buffer circuit 204.

Note that whether the transistor included in the driver circuit is normally on or off might vary among substrates even when manufacturing steps are the same. Therefore, with the structure of this embodiment, whether the transistor is normally on or off can be judged among substrates used for display devices and correction is possible. Thus, the yield of the driver circuit can be improved.

Note that the reference potential used for comparison in the comparator 203 may be set as appropriate by monitoring of the increase in the potential of the node NE when the transistor is normally on and the decrease in the potential of the node NE when the transistor is normally off in advance.

Next, examples of the first circuit 101, the second circuit 102, and the third circuit 103 are described with reference to FIGS. 3A to 3F.

Figure 3A:
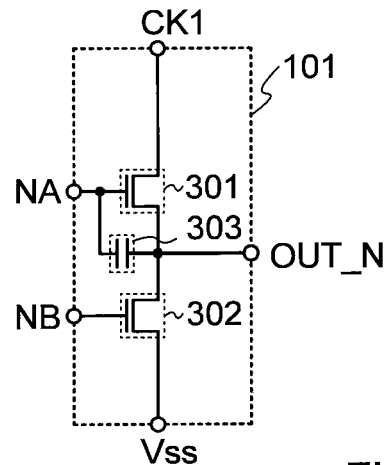
FIGS. 3A to 3F each illustrate an example of a circuit included in a pulse output circuit.
Figure 11A:
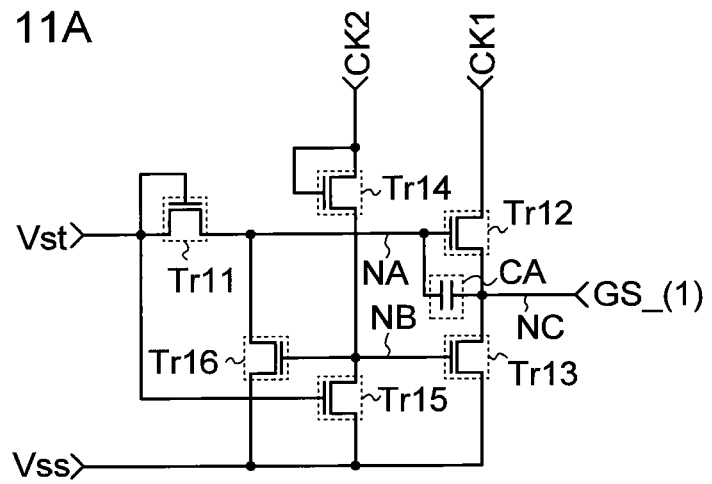
FIGS. 11A and 11B illustrate problems of a conventional circuit.
Figure 11B:
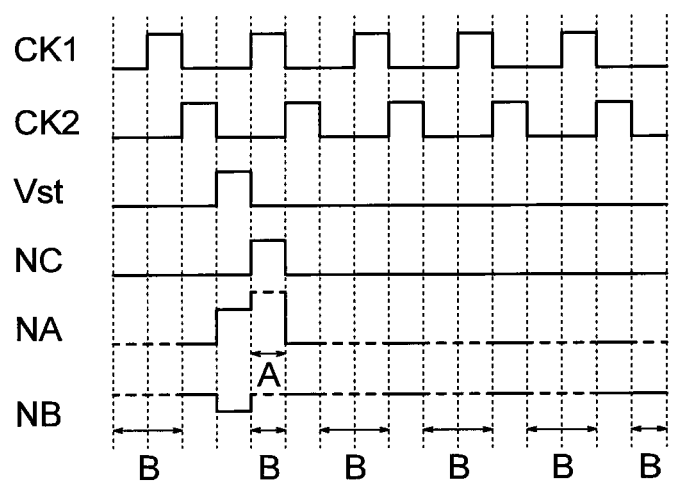

As an example of the first circuit 101 illustrated in FIG. 3A, a transistor 301 and a transistor 302 are provided, as in FIG. 11A. A gate of the transistor 301 may be connected to the first node NA. A gate of the transistor 302 may be connected to the second node NB. A drain terminal of the transistor 301 may be connected to a wiring to which a clock signal CK1 (also referred to as a first clock signal) is supplied. A source terminal of the transistor 301 and a drain terminal of the transistor 302 may be connected to each other so as to serve as a terminal for outputting the output signal OUT_N. A source terminal of the transistor 302a may be connected to a wiring for supplying the low power supply potential $V_{ss}$. Further, a capacitor 303 may be provided between the gate and the source of the transistor 301 as necessary. With the provision of the capacitor, bootstrap easily occurs between the gate and the source of the transistor 301 when the first node is made to be in a floating state, which is preferable.

Figure 3B:
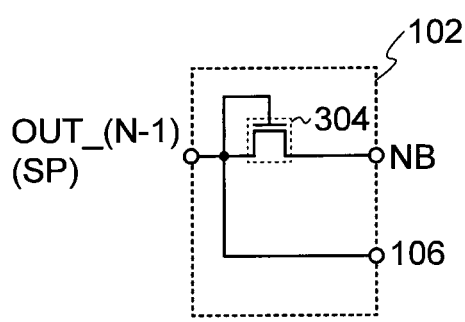
Figure 3C:
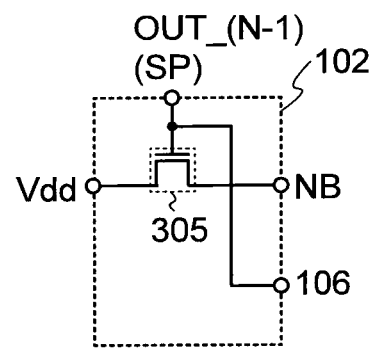

Then, as an example of the second circuit 102 illustrated in FIG. 3B, a transistor 304 is provided, as in FIG. 11A. A terminal to which a gate and a drain terminal of the transistor 304 and the gate of the second transistor 106 are connected may be connected to a terminal to which the output signal OUT_(N−1) in the preceding stage of the pulse output circuit is input. A source terminal of the transistor 304 may be connected to the second node NB. In addition, as a structure which is different from the structure of the second circuit 102 in FIG. 3B, a transistor 305 is provided as illustrated in FIG. 3C. A drain terminal of the transistor 305 may be connected to a wiring to which the high power supply potential $V_{dd}$ is supplied. A terminal to which a gate of the transistor 305 and the gate of the second transistor 106 are connected may be connected to a terminal to which the output signal OUT_(N−1) in the preceding stage of the pulse output circuit is input. A source terminal of the transistor 305 may be connected to the second node NB.

Figure 3D:
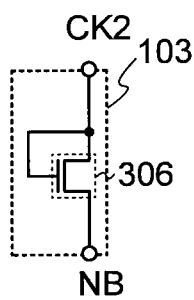
Figure 3E:
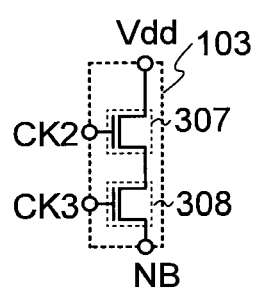

Then, as an example of the third circuit 103 illustrated in FIG. 3D, a transistor 306 is provided, as in FIG. 11A. A gate and a drain terminal of the transistor 306 are connected to a wiring to which a clock signal CK2 (also referred to as a second clock signal) is supplied. A source terminal of the transistor 306 is connected to the second node NB. Note that the clock signal CK2 in FIG. 3D is preferably a signal obtained by inversion of the clock signal CK1 in FIG. 3A. In addition, as a structure which is different from the structure of the third circuit 103 in FIG. 3D, a transistor 307 and a transistor 308 are provided as illustrated in FIG. 3E. A gate of the transistor 307 is connected to a wiring to which the clock signal CK2 (also referred to as the second clock signal) is supplied. A drain terminal of the transistor 307 is connected to a wiring to which the high power supply potential $V_{dd}$ is supplied. A source terminal of the transistor 307 and a drain terminal of the transistor 308 are connected to each other. A gate of the transistor 308 is connected to a wiring to which a clock signal CK3 (also referred to as a third clock signal) is supplied. A source terminal of the transistor 308 is connected to the second node NB. Note that it is preferable that the clock signal CK2 in FIG. 3D be a signal delayed from the clock signal CK1 in FIG. 3A by ¼ cycle and the clock signal CK3 in FIG. 3E be a signal delayed from the clock signal CK2 in FIG. 3E by ¼ cycle.

Figure 3F:
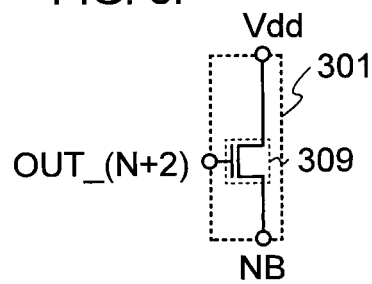

In the structure illustrated in FIG. 1, a circuit may be provided in addition to the first circuit 101, the second circuit 102, and the third circuit 103. For example, a circuit illustrated having a transistor 309 illustrated in FIG. 3F may be provided so as to be connected to the second node NB. Concerning the transistor 309 in FIG. 3F, a drain terminal may be connected to a terminal to which the high power supply potential $V_{dd}$ is supplied. A gate may be connected to a terminal to which an output signal OUT_(N+2) in a stage following the next stage of a pulse output circuit is input. A source terminal may be connected to the second node NB. With the structure to which the circuit illustrated in FIG. 3F is added, the potential of the second node NB can be controlled more adequately, which is preferable.

Note that the number of the first circuits 101, the number of the second circuits 102, and the number of the third circuits 103 can be each plural.

Next, the structure of a shift register, which is a driver circuit including plural stages of pulse output circuits, is described with reference to FIGS. 4A to 4C. Advantageous effects and the like of the structure illustrated in this embodiment are described in detail. Note that FIG. 4C illustrates a specific structure when the circuit in FIG. 3A is used as the first circuit 101 in FIG. 1, the circuit in FIG. 3C is used as the second circuit 102 in FIG. 1, the circuit in FIG. 3E is used as the third circuit 103 in FIG. 1, and the circuit in FIG. 3F is used as the second node NB. Note that FIG. 4C illustrates an example where the number of the first circuits 101 is plural.

Figure 4A:
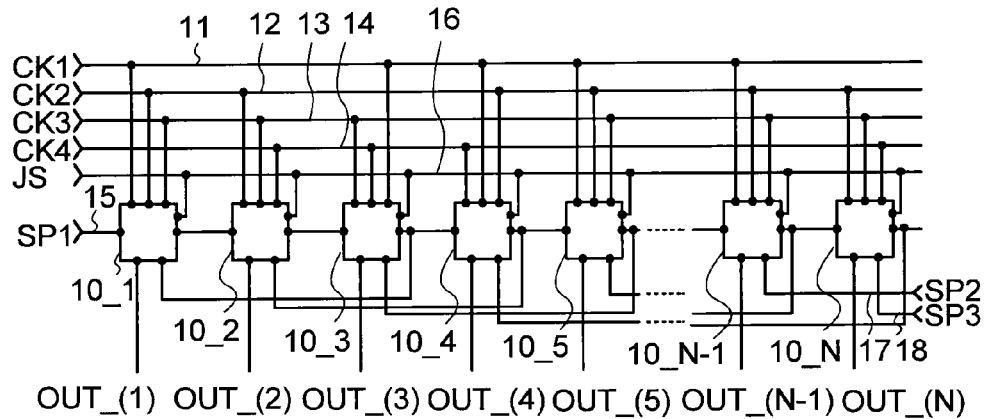
FIGS. 4A to 4C illustrate examples of a pulse output circuit and a shift register.

A shift register illustrated in FIG. 4A includes first to N-th pulse output circuits 10_1 to 10_N (N is a natural number greater than or equal to 3). In the first to N-th pulse output circuits 10_1 to 10_N in the shift register illustrated in FIG. 4A, a first clock signal CK1, a second clock signal CK2, a third clock signal CK3, and a fourth clock signal CK4 are supplied from a first wiring 11, a second wiring 12, a third wiring 13, and a fourth wiring 14, respectively. A start pulse SP1 (a first start pulse) is input from a fifth wiring to the first pulse output circuit 10_1. To an n-th pulse output circuit 10_n of the second or subsequent stage (n is a natural number greater than or equal to 2 and less than or equal to N), a signal from a pulse output circuit of the preceding stage (such a signal is referred to as a preceding-stage signal OUT(n−1)) is input. To the first pulse output circuit 10_1, a signal from the third pulse output circuit 10_3 of a stage following the next stage is input. Similarly, to the n-th pulse output circuit 10_n of the second or subsequent stage, a signal from the (n+2)th pulse output circuit 10_(n+2) of the stage following the next stage (such a signal is referred to as a subsequent-stage signal OUT(n+2)) is input. Therefore, from the pulse output circuits of the respective stages, first output signals OUT(1)(SR) to OUT(N)(SR) to be input to the pulse output circuits of the subsequent stages and/or the stages before the preceding stages and second output signals OUT(1) to OUT(N) to be input to different circuits or the like are output. Further, a judgment signal JS from the judgment circuit 111 is supplied from a sixth wiring 16 to the pulse output circuits of the respective stages. Note that since the subsequent-stage signal OUT(n+2) is not input to the last two stages of the shift register as illustrated in FIG. 4A, a second start pulse SP2 and a third start pulse SP3 may be input from a seventh wiring 17 and an eighth wiring 18 to the last two stages, for example. Alternatively, signals may be generated inside. For example, a (n+1)th pulse output circuit 10(n+1) and a (n+2)th pulse output circuit 10(n+2) which do not contribute to output of pulses to a display portion (such circuits are also referred to as dummy stages) may be provided, and signals corresponding to a second start pulse (SP2) and a third start pulse (SP3) may be generated from the dummy stages.

Note that each of the first to fourth clock signals (CK1) to (CK4) is a signal that oscillates between an H-level signal and an L-level signal at regular intervals. Further, the first to fourth clock signals (CK1) to (CK4) are delayed by ¼ cycle sequentially (i.e., they are 90° out of phase with each other). In this embodiment, driving of the pulse output circuits is controlled with the first to fourth clock signals (CK1) to (CK4). Note that the clock signal is also referred to as GCK or SCK in some cases depending on a driver circuit to which the clock signal is input, and the clock signal is referred to as CK in the following description.

Figure 4B:
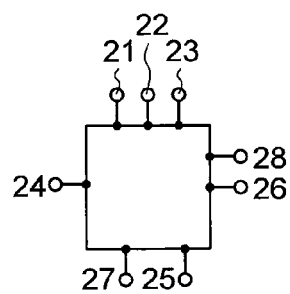
Figure 4C:
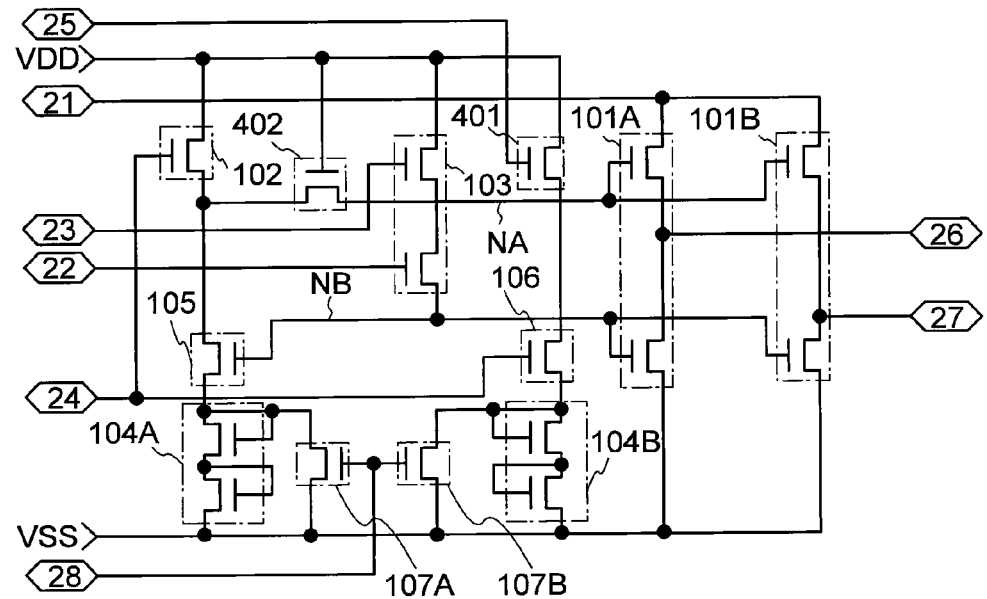

Each of the first to N-th pulse output circuits 10_1 to 10_N includes a first input terminal 21, a second input terminal 22, a third input terminal 23, a fourth input terminal 24, a fifth input terminal 25, a first output terminal 26, a second output terminal 27, and a sixth input terminal 28 (see FIG. 4B).

FIG. 4B is one of the pulse output circuits 10_n illustrated in FIG. 4A. The first input terminal 21, the second input terminal 22, and the third input terminal 23 are electrically connected to any of the first to fourth wirings 11 to 14. For example, in the first pulse output circuit 10_1 in FIGS. 4A and 4B, the first input terminal 21 is electrically connected to the first wiring 11; the second input terminal 22 is electrically connected to the second wiring 12; and the third input terminal 23 is electrically connected to the third wiring 13. In the second pulse output circuit 10_2, the first input terminal 21 is electrically connected to the second wiring 12; the second input terminal 22 is electrically connected to the third wiring 13; and the third input terminal 23 is electrically connected to the fourth wiring 14.

Further, in the first pulse output circuit 10_1 in FIGS. 4A and 4B, a start pulse is input to the fourth input terminal 24; a subsequent-stage signal OUT(3) is input to the fifth input terminal 25; the first output signal OUT(1)(SR) is output from the first output terminal 26; the second output signal OUT(1) is output from the second output terminal 27; and the judgment signal JS is input from the sixth input terminal 28.

Next, an example of a specific circuit structure of the pulse output circuit is described with reference to FIG. 4C.

As in FIG. 1, the first pulse output circuit 10_1 includes first circuits 101A and 101B, the second circuit 102, the third circuit 103, the fourth circuits 104A and 104B, the first transistor 105, the second transistor 106, and the switches 107A and 107B formed using transistors. In addition to the structure in FIG. 1, a transistor 401 which is connected to the second node NB is provided. The transistor 401 is a transistor for raising the potential of the second node NB in accordance with timing of when the subsequent-stage signal OUT(n+2) is changed into an H-level signal. In addition to the structure in FIG. 1, a transistor 402 may be provided in the first node NA so that a gate of the transistor 402 is connected to a wiring to which the high power supply potential $V_{dd}$ is supplied. When the transistor 402 is provided in the first node NA, a gate of a transistor in the first circuit 101A is easily made to be in a floating state, which is preferable. Here, each of the first to fourth clock signals (CK1) to (CK4) oscillates between an H-level signal and an L-level signal at regular intervals; the clock signal at an H level is $V_{dd}$ and the clock signal at an L level is $V_{ss}$.

In the case where the pulse output circuit in FIG. 4C is the first pulse output circuit 10_1, the first clock signal CK1 is input to the first input terminal 21; the second clock signal CK2 is input to the second input terminal 22; the third clock signal CK3 is input to the third input terminal 23; the start pulse SP is input to the fourth input terminal 24; a subsequent-stage signal OUT(3) is input to the fifth input terminal 25; the first output signal OUT(1)(SR) is output from the first output terminal 26; the second output signal OUT(1) is output from the second output terminal 27; and the judgment signal JS is input from the sixth input terminal 28.

Figure 5:
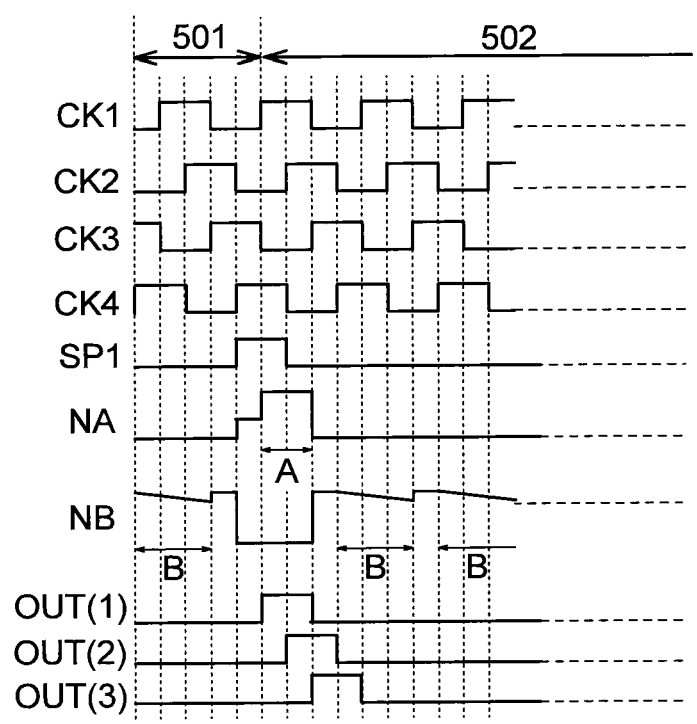
FIG. 5 is a timing chart of a shift register.

FIG. 5 illustrates a timing chart of a shift register including a plurality of pulse output circuits illustrated in FIG. 4C. Note that when the shift register is included in a scan line driver circuit, a period 501 in FIG. 5 corresponds to a vertical retrace period and a period 502 corresponds to a gate selection period.

In order that the output signal OUT_(N) be changed into an H-level signal, the node NA in FIG. 4C is regularly made to be in a floating state and supplied with a predetermined potential. In a period denoted by an arrow A in FIG. 5 is a period during which the node NA is in a floating state. When the node NA is made to be in a floating state, the decrease in potential due to leakage current becomes problematic. Similarly, in a period denoted by an arrow B in FIG. 5 is a period during which the node NB is in a floating state. When the node NB is made to be in a floating state, the decrease in potential due to leakage current becomes problematic. Specifically, the amount of the decrease in potential in the period denoted by the arrow A and the period denoted by the arrow B during which the node NA and the node NB are in a floating state is changed depending on whether the transistor is normally on or off, which is problematic. Even when a circuit for correcting the normally-on state or the normally-off state of the transistor is added, the circuit cannot operate precisely when the normally-on state and the normally-off state of transistors vary among substrates.

Next, the operation of the pulse output circuit illustrated in FIG. 1 is described with reference to FIG. 6. Further, advantageous effects of the operation of a driver circuit including the pulse output circuit in FIG. 1 for realizing accurate operation regardless of whether the transistor is normally on or off when the normally-on state and the normally-off state of transistors vary among substrates, are described.

Figure 6:
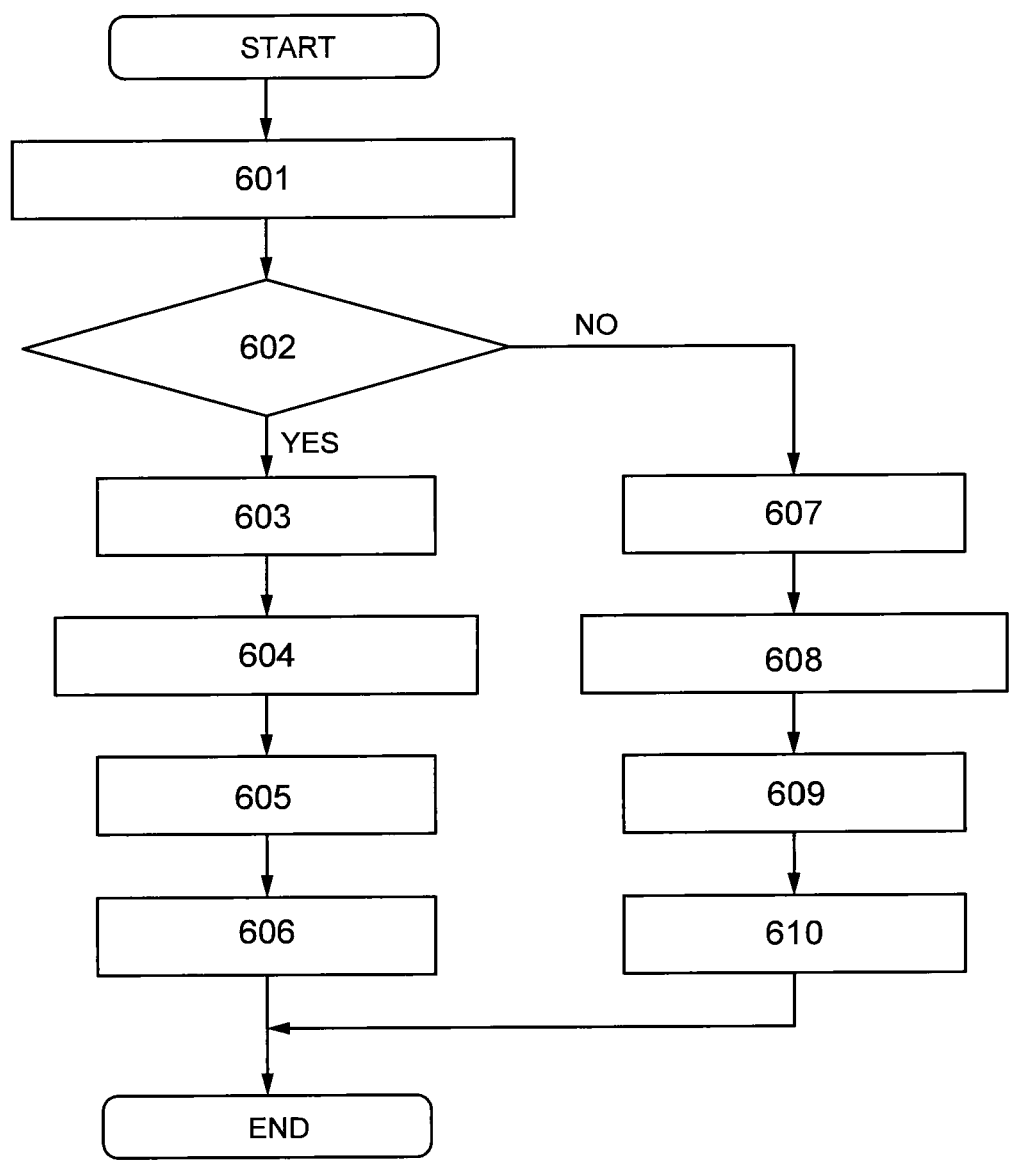
FIG. 6 is a flow chart illustrating operation of a pulse output circuit.

First, as an indicator of whether a transistor included in each circuit is normally on or off, the judgment circuit 111 judges whether the transistor 202 is normally on or off and judges whether the potentials of the third nodes N1 and N2 are raised by the fourth circuits 104A and 104B (Step 601 in FIG. 6).

Then, the judgment circuit 111 illustrated in FIG. 2 judges whether the potential of the node NE is higher than a reference potential (Step 602 in FIG. 6). When the amount of current flowing through the transistor 202 is large and the potential of the node NE is higher than the reference potential, the judgment circuit 111 judges that the transistor 202 is normally off (Step 603 in FIG. 6).

Then, the judgment circuit 111 outputs H-level signals to the switches 107A and 107B through the comparator 203 and the buffer circuit 204 (Step 604 in FIG. 6). In the case where the switches 107A and 107B are n-channel transistors, the switches 107A and 107B are turned on (Step 605 in FIG. 6). Accordingly, the potentials of the third nodes N1 and N2 are lowered to the low power supply potential $V_{ss}$ (corresponding to the potential of the wiring 110) (Step 606 in FIG. 6).

In contrast, when the amount of current flowing transistor through the transistor 202 is small and the potential of the node NE is lower than the reference potential, the judgment circuit 111 judges that the transistor 202 is normally on (Step 607 in FIG. 6).

Then, the judgment circuit 111 outputs L-level signals to the switches 107A and 107B through the comparator 203 and the buffer circuit 204 (Step 608 in FIG. 6). In the case where the switches 107A and 107B are n-channel transistors, the switches 107A and 107B are turned off (Step 609 in FIG. 6). Accordingly, the potentials of the third nodes N1 and N2 are held at potentials which are higher than the low power supply potential $V_{ss}$ (Step 610 in FIG. 6).

Through the above operation, it is possible to provide a pulse output circuit with which gate-source voltage $V_{gs}$ high enough to make transistors on or off regardless of whether the first transistor 105 and the second transistor 106 are normally on or off can be obtained. In other words, switching characteristics can be improved by the increase in the gate-source voltage $V_{gs}$ of the transistors when the transistors are normally on, and the sufficiently high gate-source voltage $V_{gs}$ can be obtained by the decrease in the potentials of source terminals when the transistors are normally off. Therefore, even when whether the transistor is normally on or off varies among substrates, a driver circuit with higher accuracy and fewer malfunctions can be provided. In other words, it is possible to provide a driver circuit where malfunctions in the circuit can be suppressed even when a thin film transistor is changed into an enhancement transistor or a depletion transistor due to variation in the threshold voltage that is caused by a manufacturing condition or the like of the thin film transistor.

This embodiment can be combined with any of the structures described in the other embodiments as appropriate.

Embodiment 2

In this embodiment, the driver circuit described in the above embodiment and a cross-sectional view of a display device including a display portion controlled by the driver circuit are described with reference to FIG. 7. Further, in this embodiment, an example of a liquid crystal display device is described as the display device; however, the display device can be used as an EL display device including a light-emitting element such as an organic EL element or an electrophoretic display device including an electrophoretic element. Note that the structure described in the above embodiment can be applied not only to the driver circuit of the display device but also to a different device such as a driver circuit for an optical sensor.

Figure 7:
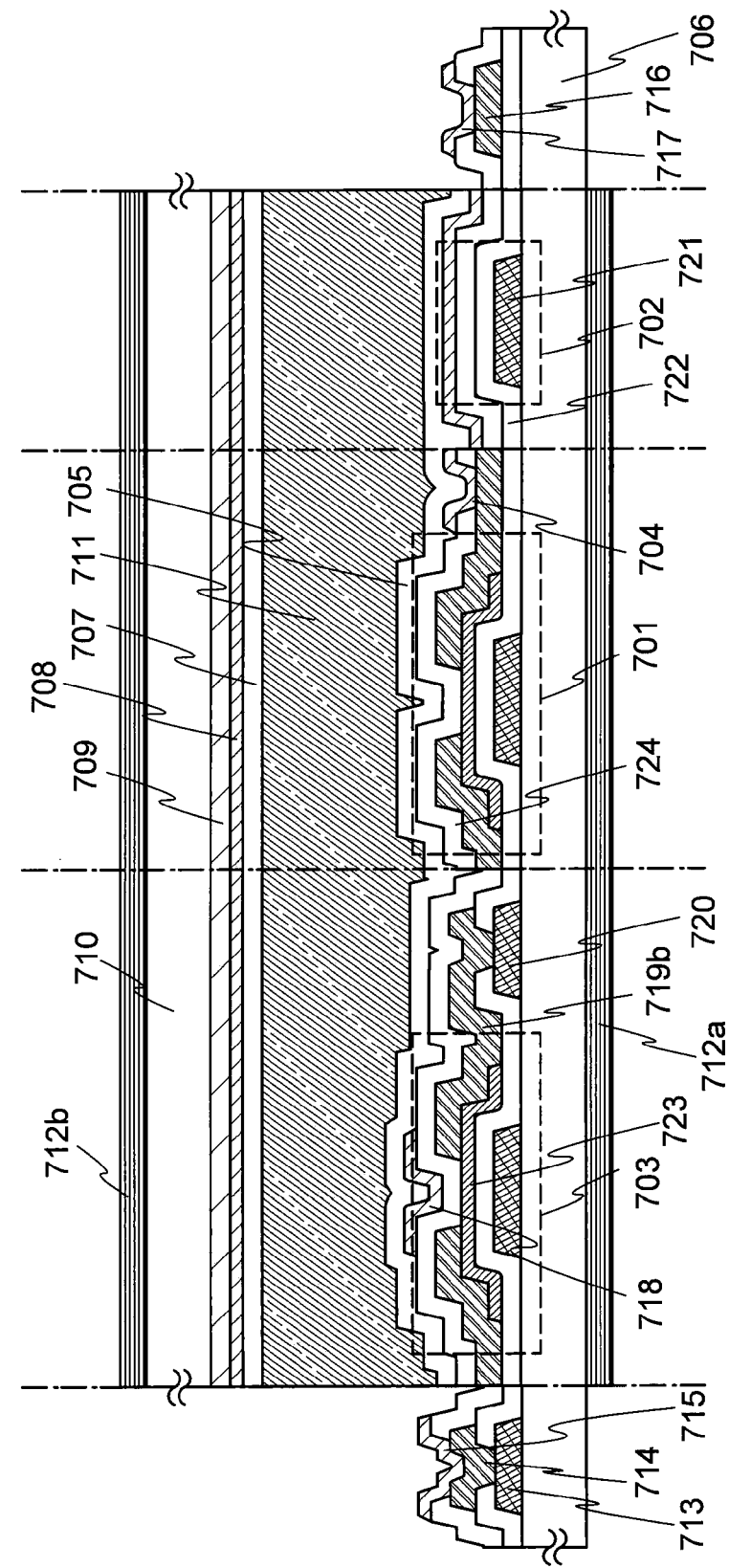
FIG. 7 illustrates an example of a cross-sectional view of a display device.

A liquid crystal display device which is one embodiment of the present invention is illustrated in FIG. 7. In the liquid crystal display device in FIG. 7, a substrate 706 which is provided with a pixel portion including a thin film transistor 701 and a capacitor 702, a driver circuit portion including a thin film transistor 703, a pixel electrode layer 704, and an insulating layer 705 serving as an alignment film, and a counter substrate 710 which is provided with an insulating layer 707 serving as an alignment film, a counter electrode layer 708, and a coloring layer 709 serving as a color filter face each other with a liquid crystal layer 711 positioned between the substrates. The substrate 706 is provided with a polarizing plate (a layer including a polarizer, also simply referred to as a polarizer) 712a on a side opposite to the liquid crystal layer 711, and the counter substrate 710 is provided with a polarizing plate 712b on a side opposite to the liquid crystal layer 711. A first terminal 713, a connection electrode 714, and a terminal electrode 715 for connection are provided in a terminal portion for a gate wiring, and a second terminal 716 and a terminal electrode 717 for connection are provided in a terminal portion for a source wiring.

In the thin film transistor 703 of the driver circuit portion, a conductive layer 718 is provided over an oxide insulating layer 724 above a semiconductor layer 723 which is formed over a gate electrode layer 721 and a gate insulating layer 722, and a drain electrode layer 719b is electrically connected to a conductive layer 720 which is formed in the same step as the gate electrode layer. In the pixel portion, a drain electrode layer of the thin film transistor 701 is electrically connected to the pixel electrode layer 704.

The use of an oxide semiconductor for a thin film transistor leads to reduction in manufacturing cost. The thin film transistor formed using an oxide semiconductor has high field-effect mobility and is favorably used in a pixel portion and a driver circuit of a display device. On the other hand, an oxide semiconductor tends to have n-type conductivity due to a defect of void by lack of oxygen even when an extrinsic impurity is not added. When an oxide insulating film is formed in contact with an oxide semiconductor layer, a thin film transistor with stable electrical characteristics can be obtained. Even if an oxide semiconductor is made to have n-type conductivity so that a normally-on thin film transistor is formed, a driver circuit can operate stably when the driver circuit of this embodiment is used.

Note that although an example of a thin film transistor whose channel is formed using an oxide semiconductor is described in this embodiment, the structure described in Embodiment 1 can be used regardless of whether a thin film transistor included in a driver circuit is normally on or off. Therefore, for example, the structure described in Embodiment 1 can be used for a normally-on thin film transistor when a semiconductor layer of the thin film transistor formed using amorphous silicon intentionally or unintentionally contains an impurity imparting n-type conductivity. Further, the structure described in Embodiment 1 can be used for a normally-on thin film transistor where a parasitic channel is formed on a side opposite to a gate insulating film of a semiconductor layer included in a channel region (a back channel side) by accumulation of electric charge.

Since the channel formation region in the semiconductor layer is a high-resistant region, electrical characteristics of the thin film transistor are stabilized and the increase in the amount of off-state current can be prevented. Therefore, a semiconductor device including a highly reliable thin film transistor with favorable electrical characteristics can be provided.

Since a thin film transistor is easily broken due to static electricity or the like, a protection circuit is preferably provided over the same substrate as the pixel portion or the drive circuit. The protection circuit preferably include a non-linear element formed using an oxide semiconductor layer. For example, protection circuits are provided between the pixel portion and a scan line input terminal and between the pixel portion and a signal line input terminal. In this embodiment, a plurality of protection circuits are provided so as to prevent breakage of the a pixel transistor and the like when surge voltage due to static electricity or the like is applied to a scan line, a signal line, and a capacitor bus line. Therefore, the protection circuit is formed so as to release electric charge to a common wiring when surge voltage is applied to the protection circuit. Further, the protection circuit includes non-linear elements arranged in parallel to each other with the scan line therebetween. The non-linear element includes a two-terminal element such as a diode or a three-terminal element such as a transistor. For example, the non-linear element can be formed in the same step as the thin film transistor 701 in the pixel portion, and can be made to have the same properties as a diode by connection of a gate terminal to a drain terminal of the non-linear element.

This embodiment can be combined with any of the structures described in the other embodiments as appropriate.

Embodiment 3

In this embodiment, an example in which at least some of driver circuits and a thin film transistor provided in a pixel portion are formed over the same substrate is described below. Note that the thin film transistor formed over the substrate may be formed as illustrated in the cross-sectional view in Embodiment 2.

Figure 8A:
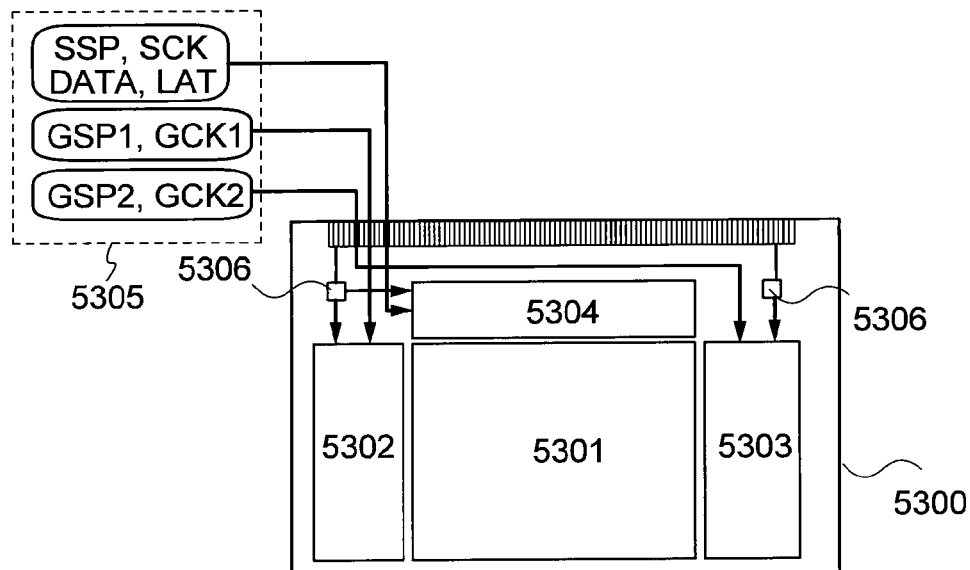
FIGS. 8A and 8B are examples of a block diagram of a display device.

FIG. 8A illustrates an example of a block diagram of an active matrix display device. A pixel portion 5301, a first scan line driver circuit 5302, a second scan line driver circuit 5303, a signal line driver circuit 5304, and a judgment circuit 5306 are provided over a substrate 5300 in the display device. In the pixel portion 5301, a plurality of signal lines extended from the signal line driver circuit 5304 are provided and a plurality of scan lines extended from the first scan line driver circuit 5302 and the second scan line driver circuit 5303 are provided. Note that pixels each including a display element are arranged in matrix in regions where the scan lines and the signal lines intersect with each other. Further, the substrate 5300 in the display device is connected to a timing control circuit 5305 (also referred to as a controller or a control IC) through a connection portion such as an FPC (flexible printed circuit).

In FIG. 8A, the first scan line driver circuit 5302, the second scan line driver circuit 5303, the signal line driver circuit 5304, and the judgment circuit 5306 are formed over the same substrate 5300 as the pixel portion 5301. Thus, the number of components of a driver circuit and the like which are provided outside is reduced, so that cost can be reduced. Further, when wirings are extended from a driver circuit provided outside the substrate 5300, the number of connections in the connection portion can be reduced, and reliability and yield can be improved. Note that a plurality of the judgment circuits 5306 may be formed over the substrate. For example, the judgment circuit 5306 may be provided in each driver circuit.

Note that the timing control circuit 5305 supplies, for example, a first scan line driver circuit start signal (GSP1) (a start signal is also referred to as a start pulse) and a scan line driver circuit clock signal (GCK1) to the first scan line driver circuit 5302. Further, the timing control circuit 5305 supplies, for example, a second scan line driver circuit start signal (GSP2) and a scan line driver circuit clock signal (GCK2) to the second scan line driver circuit 5303. The timing control circuit 5305 supplies a signal line driver circuit start signal (SSP), a signal line driver circuit clock signal (SCK), video signal data (DATA, also simply referred to as a video signal), and a latch signal (LAT) to the signal line driver circuit 5304. Note that each clock signal may be a plurality of clock signals with shifted phases or may be supplied together with a signal (CKB) obtained by inversion of the clock signal. It is possible to eliminate one of the first scan line driver circuit 5302 and the second scan line driver circuit 5303.

Figure 8B:
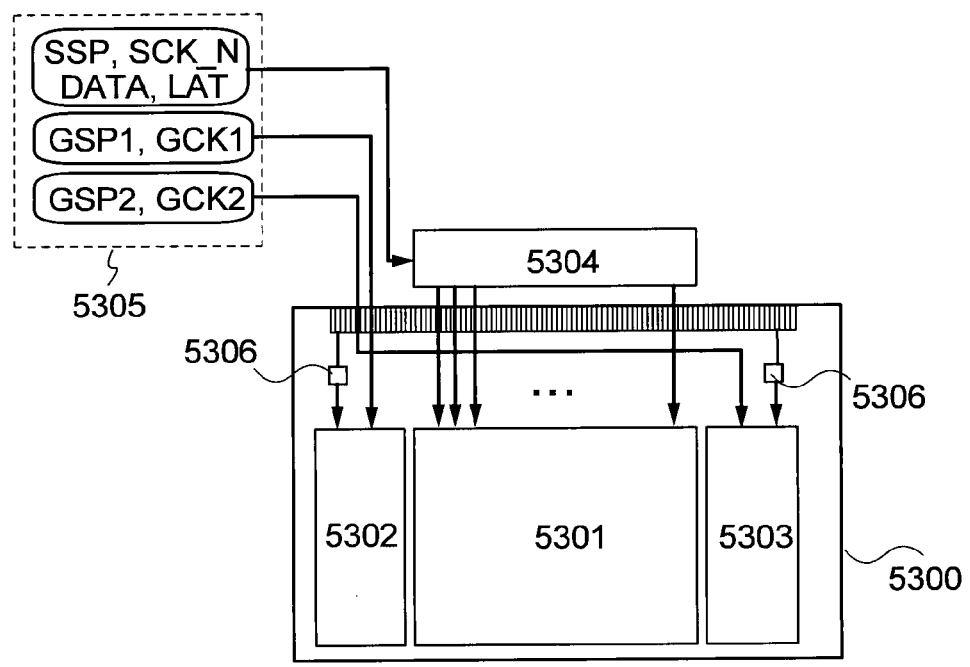

FIG. 8B illustrates a structure in which the judgment circuit 5306, the first scan line driver circuit 5302, and the second scan line driver circuit 5303 are formed over the same substrate 5300 as the pixel portion 5301, and the signal line driver circuit 5304 is formed over a substrate which is different from the substrate 5300 where the pixel portion 5301 is formed.

Figure 9A:
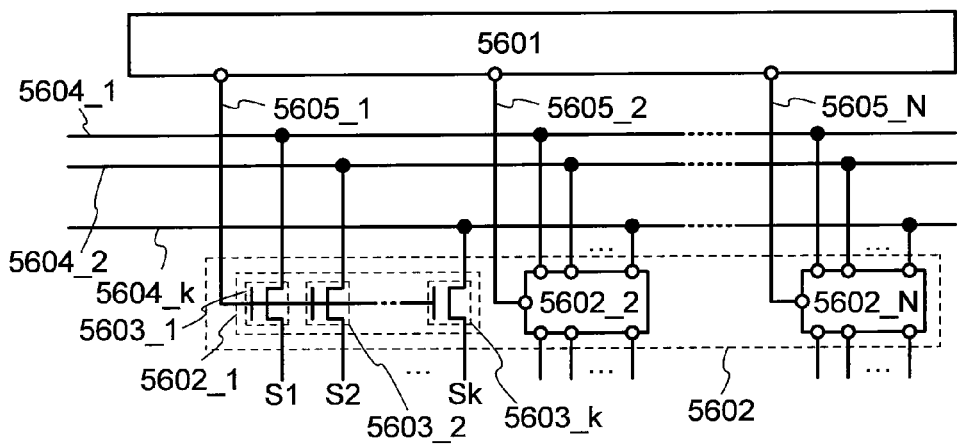
FIGS. 9A and 9B illustrate examples of a block diagram and a timing chart of a shift register.
Figure 9B:
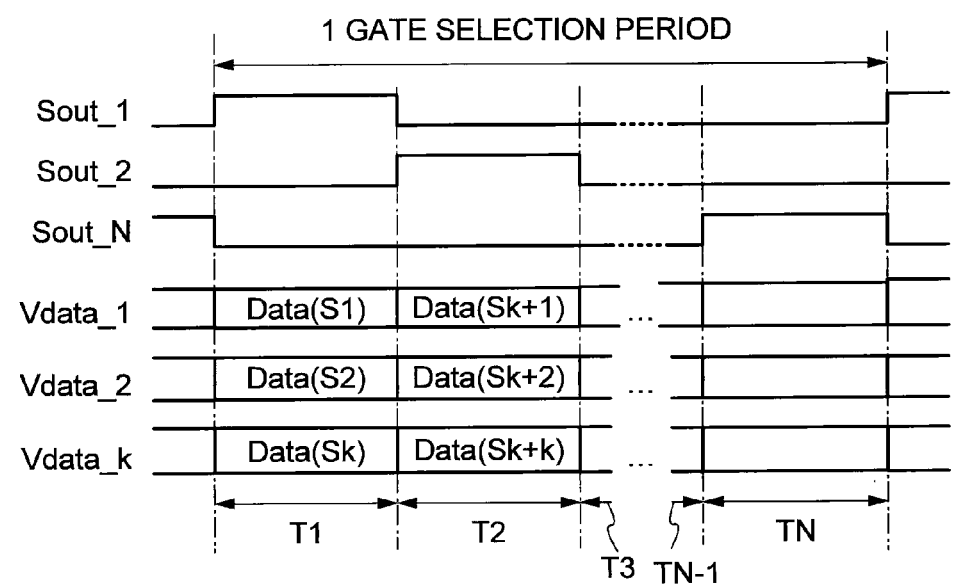

The thin film transistors in Embodiments 1 and 2 are n-channel TFTs. FIGS. 9A and 9B illustrate examples of a structure and operation of a signal line driver circuit formed using n-channel TFTs.

The signal line driver circuit includes a shift register 5601 and a switching circuit 5602. The switching circuit 5602 includes a plurality of switching circuits 5602_1 to 5602_N (N is a natural number). The switching circuits 5602_1 to 5602_N each include a plurality of thin film transistors 5603_1 to 5603_k (k is a natural number). An example where the thin film transistors 5603_1 to 5603_k are n-channel TFTs is described below.

A connection relationship in the signal line driver circuit is described using the switching circuit 5602_1 as an example. First terminals of the thin film transistors 5603_1 to 5603_k are connected to wirings 5604_1 to 5604_k, respectively. Second terminals of the thin film transistors 5603_1 to 5603_k are connected to signal lines S1 to Sk, respectively. Gates of the thin film transistors 5603_1 to 5603_k are connected to a wiring 5605_1.

The shift register 5601 has a function of sequentially selecting the switching circuits 5602_1 to 5602_N by sequentially outputting H-level signals (also referred to as H signals or signals at high power supply potential levels) to the wiring 5605_1 and wirings 5605_2 to 5605_N.

The switching circuit 5602_1 has a function of controlling a conduction state between the wiring 5604_1 and the signal line S1 (electrical continuity between the first terminal and the second terminal), that is, a function of controlling whether a potential of the wiring 5604_1 is supplied to the signal line S1. In this manner, the switching circuit 5602_1 functions as a selector. In a similar manner, the thin film transistors 5603_2 to 5603_k have functions of controlling conduction states between the wirings 5604_2 to 5604_k and the signal lines S2 to Sk, respectively, that is, functions of supplying potentials of the wirings 5604_2 to 5604_k to the signal lines S2 to Sk, respectively. In this manner, each of the thin film transistors 5603_1 to 5603k functions as a switch.

The video signal data (DATA) is input to each of the wirings 5604_1 to 5604_k. The video signal data (DATA) is an analog signal corresponding to an image signal or image data.

Next, the operation of the signal line driver circuit in FIG. 9A is described with reference to a timing chart in FIG. 9B. FIG. 9B illustrates examples of signals Sout_1 to Sout_N and signals Vdata_1 to Vdata_k. The signals Sout_1 to Sout_N are examples of signals output from the shift register 5601. The signals Vdata_1 to Vdata_k are examples of signals input to the wirings 5604_1 to 5604_k. Note that one operation period of the signal line driver circuit corresponds to one gate selection period in a display device. For example, one gate selection period is divided into periods T1 to TN. Each of the periods T1 to TN is a period during which the video signal data (DATA) is written to a pixel in a selected row.

In the periods T1 to TN, the shift register 5601 sequentially outputs H-level signals to the wirings 5605_1 to 5605_N. For example, in the period T1, the shift register 5601 outputs an H-level signal to the wiring 5605_1. Then, the thin film transistors 5603_1 to 5603_k are turned on, so that the wirings 5604_1 to 5604_k and the signal lines S1 to Sk are brought into conduction. At this time, Data (S1) to Data (Sk) are input to the wirings 5604_1 to 5604_k, respectively. The Data (S1) to Data (Sk) are written to pixels in first to k-th columns in a selected row through the thin film transistors 5603_1 to 5603_k, respectively. In this manner, in the periods T1 to TN, the video signal data (DATA) is sequentially written to the pixels in the selected row by k columns.

When the video signal data (DATA) is written to pixels by a plurality of columns as described above, the number of video signal data (DATA) or the number of wirings can be reduced. Thus, the number of connections with an external circuit can be reduced. Further, writing time can be extended when video signals are written to pixels by a plurality of columns; thus, insufficient writing of video signals can be prevented.

The structure of a scan line driver circuit is described. The scan line driver circuit includes a shift register. Additionally, the scan line driver circuit may include a level shifter, a buffer, or the like in some cases. In the scan line driver circuit, when a clock signal (CK) and a start pulse signal (SP) are input to the shift register, a selection signal is generated. The selection signal generated is buffered and amplified in the buffer, and the resulting signal is supplied to a corresponding scan line. Gate electrodes of transistors in pixels of one line are connected to the scan line. Since the transistors in the pixels of one line have to be turned on all at once, a buffer which can supply a large amount of current is used.

This embodiment can be combined with any of the structures described in the other embodiments as appropriate.

Embodiment 4

In this embodiment, examples of electronic devices each including the display device described in the above embodiment in a display portion are described.

The content (or part of the content) described in each drawing in the above embodiment can be applied to a variety of electronic devices. Specifically, it can be applied to display portions of electronic devices. As such electronic devices, there are cameras such as video cameras and digital cameras, goggle-type displays, navigation systems, audio reproducing devices (e.g., car audio equipment or audio component sets), computers, game machines, portable information terminals (e.g., mobile computers, mobile phones, portable game machines, or e-book readers), image reproducing devices provided with recording media (specifically devices which reproduce the content of recording media such as digital versatile discs (DVDs) and have displays for displaying the reproduced images), and the like.

Figure 10A:
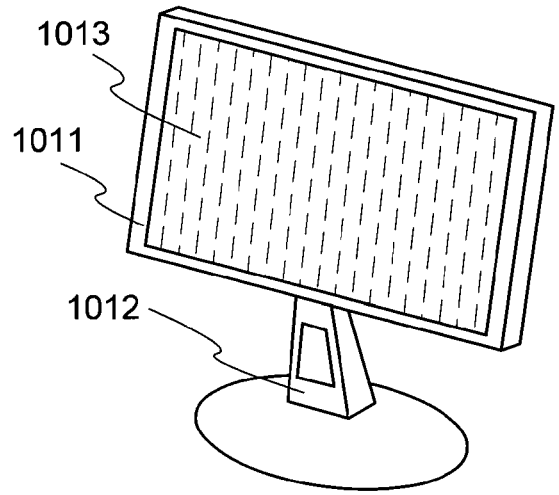
FIGS. 10A to 10C illustrate examples of display devices.

FIG. 10A illustrates a display, which include a housing 1011, a support 1012, and a display portion 1013. The display illustrated in FIG. 10A has a function of displaying a variety kinds of information (e.g., still images, moving images, and text images) on the display portion. Note that the display illustrated in FIG. 10A is not limited to having this function. The display illustrated in FIG. 10A can have a variety of functions.

Figure 10B:
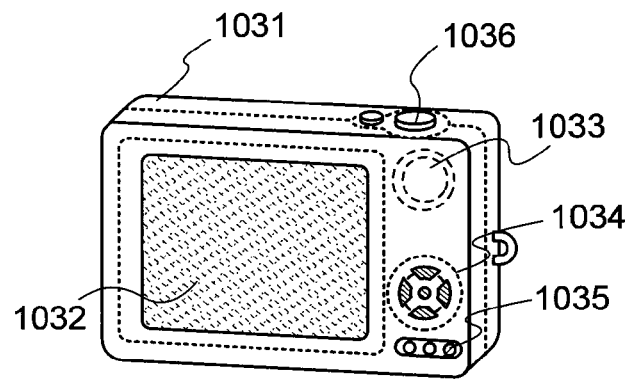

FIG. 10B illustrates a camera, which includes a main body 1031, a display portion 1032, an image reception portion 1033, operation keys 1034, an external connection port 1035, and a shutter button 1036. The camera illustrated in FIG. 10B has a function of taking still images and a function of taking moving images. Note that the camera illustrated in FIG. 10B is not limited to having these functions. The camera illustrated in FIG. 10B can have a variety of functions.

Figure 10C:
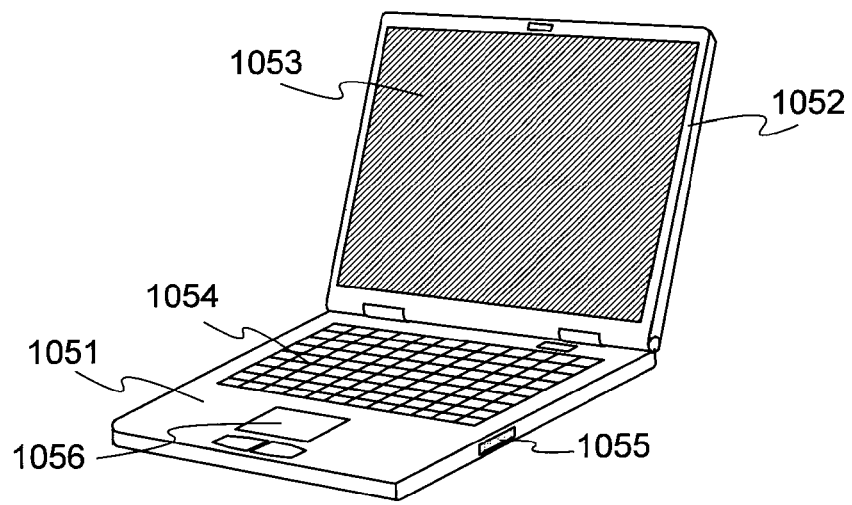

FIG. 10C illustrates a computer, which includes a main body 1051, a housing 1052, a display portion 1053, a keyboard 1054, an external connection port 1055, and a pointing device 1056. The computer illustrated in FIG. 10C has a function of displaying a variety kinds of information (e.g., still images, moving images, and text images) on the display portion. Note that the computer illustrated in FIG. 10C is not limited to having this function. The computer illustrated in FIG. 10C can have a variety of functions.

When the display device described in the above embodiment is used in a display portion of this embodiment, the number of signal lines and power supply lines which are connected to pixels included in the display portions in FIGS. 10A to 10C can be reduced. Then, the number of elements in a signal line driver circuit connected to the signal lines can be reduced, so that cost can be reduced and high-resolution images can be displayed on the display portions.

This embodiment can be combined with any of the structures described in the other embodiments as appropriate.

This application is based on Japanese Patent Application serial No. 2009-214297 filed with Japan Patent Office on Sep. 16, 2009, the entire contents of which are hereby incorporated by reference.

EXPLANATION OF REFERENCE

10: pulse output circuit, 11: wiring, 12: wiring, 13: wiring, 14: wiring, 15, wiring, 16: wiring, 17: wiring, 18: wiring, 21: input terminal, 22: input terminal, 23: input terminal, 24: input terminal, 25: input terminal, 26: output terminal, 27: output terminal, 28: input terminal, 100: pulse output circuit, 101: first circuit, 102: second circuit, 103: third circuit, 105: first transistor, 104A: fourth circuit, 104B: fourth circuit, 106: second transistor, 107A: switch, 107B: switch, 110: wiring, 111: judgment circuit, 201: constant current source, 202: transistor, 203: comparator, 204: buffer circuit, 301: transistor, 302: transistor, 303: capacitor, 304: transistor, 305: transistor, 306: transistor, 307: transistor, 308: transistor, 309: transistor, 401: transistor, 402: transistor, 501: period, 502: period, 601: step, 602: step, 603: step, 604: step, 605: step, 606: step, 607: step, 608: step, 609: step, 610: step, 701: thin film transistor, 702: capacitor, 703: thin film transistor, 704: pixel electrode layer, 705: insulating layer, 706: substrate, 707: insulating layer, 708: counter electrode layer, 709: coloring layer, 710: counter substrate, 711: liquid crystal layer, 712a: polarizing plate, 712b: polarizing plate, 713: terminal, 714: connection electrode, 715: terminal electrode, 716: terminal, 717: terminal electrode, 718: conductive layer, 719b: drain electrode layer, 720: conductive layer, 721: gate electrode layer, 722: gate insulating layer, 723: semiconductor layer, 724: oxide insulating layer, 1011: housing, 1012: support, 1013: display portion, 101A: first circuit, 101B: first circuit, 1031: main body, 1032: display portion, 1033: image reception portion, 1034: operation key, 1035: external connection port, 1036: shutter button, 1051: main body, 1052: housing, 1053: display portion, 1054: keyboard, 1055: external connection port, 1056: pointing device, 108A: third transistor, 108B: third transistor, 109A: fourth transistor, 109B: fourth transistor, 404B: circuit, 5300: substrate, 5301: pixel portion, 5302: scan line driver circuit, 5303: scan line driver circuit, 5304: signal line driver circuit, 5305: timing control circuit, 5306: judgment circuit, 5601: shift register, 5602: switching circuit, 5603: thin film transistor, 5604: wiring, and 5605: wiring

The invention claimed is:

1. A driver circuit comprising plural stages of pulse output circuits, each of the pulse output circuits comprising:
    a first circuit for outputting an output signal in accordance with a potential of a first node and a potential of a second node;
    a second circuit for supplying a signal corresponding to an output signal from a pulse output circuit in a preceding stage to the first node;
    a third circuit for intermittently supplying a signal having a high power supply potential to the second node;
    a first transistor for controlling the potential of the first node in accordance with the potential of the second node; and
    a second transistor for controlling the potential of the second node,
    wherein the second node is electrically connected to a gate of the first transistor,
    wherein the signal corresponding to the output signal from the pulse output circuit in the preceding stage is supplied to a gate of the second transistor,
    wherein a fourth circuit for raising potentials of source terminals of the first and second transistors from a low power supply potential is provided between the source terminals of the first and second transistors and a wiring for supplying the low power supply potential,
    wherein a switch for setting the potentials of the source terminals of the first and second transistors to a low power supply potential is provided, and
    wherein the switch is controlled by a judgment circuit for judging whether the first and second transistors are enhancement transistors or depletion transistors.

2. The driver circuit according to claim 1,
    wherein the fourth circuit includes a transistor,
    wherein a gate and a drain terminal of the transistor are electrically connected to each other, and
    wherein a source terminal of the transistor is electrically connected to a wiring to which the low power supply potential is supplied.

3. The driver circuit according to claim 2, wherein L/W of the transistor included in the fourth circuit is higher than L/W of each of the first transistor and the second transistor.

4. The driver circuit according to claim 1, wherein the judgment circuit includes a constant current source, a transistor, a comparator, and a buffer circuit.

5. The driver circuit according to claim 1, wherein the switch is a transistor.

6. The driver circuit according to claim 1, wherein the transistor includes a semiconductor layer formed using an oxide semiconductor layer.

7. A display device comprising the driver circuit according to claim 1.

8. The display device according to claim 7, wherein the display device is incorporated in one of a camera and a computer.

* * * * *